(12) United States Patent
Ganesan et al.

(10) Patent No.: US 11,756,889 B2
(45) Date of Patent: Sep. 12, 2023

(54) ULTRATHIN BRIDGE AND MULTI-DIE ULTRAFINE PITCH PATCH ARCHITECTURE AND METHOD OF MAKING

(71) Applicant: Intel Corporation, Santa Clara, CA (US)

(72) Inventors: Sanka Ganesan, Chandler, AZ (US); Kevin McCarthy, Tempe, AZ (US); Leigh M. Tribolet, Chandler, AZ (US); Debendra Mallik, Chandler, AZ (US); Ravindranath V. Mahajan, Chandler, AZ (US); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 888 days.

(21) Appl. No.: 16/534,027

(22) Filed: Aug. 7, 2019

(65) Prior Publication Data
US 2021/0043570 A1    Feb. 11, 2021

(51) Int. Cl.
*H01L 23/538* (2006.01)
*H01L 23/00* (2006.01)
(Continued)

(52) U.S. Cl.
CPC ........ *H01L 23/5381* (2013.01); *H01L 21/486* (2013.01); *H01L 21/4853* (2013.01); *H01L 21/565* (2013.01); *H01L 21/568* (2013.01); *H01L 21/6835* (2013.01); *H01L 23/3128* (2013.01); *H01L 23/5384* (2013.01); *H01L 23/5386* (2013.01); *H01L 23/5389* (2013.01); *H01L 24/08* (2013.01); *H01L 24/19* (2013.01); *H01L 24/20* (2013.01); *H01L 24/80* (2013.01); *H01L 2221/68354* (2013.01); *H01L 2221/68372* (2013.01); *H01L 2224/08225* (2013.01); *H01L 2224/214* (2013.01); *H01L 2224/80006* (2013.01); *H01L 2224/80894* (2013.01); *H01L 2924/0105* (2013.01); *H01L 2924/01029* (2013.01); *H01L 2924/05442* (2013.01)

(58) Field of Classification Search
None
See application file for complete search history.

(56) References Cited

U.S. PATENT DOCUMENTS

| 2019/0096851 | A1* | 3/2019 | Liao | H01L 24/19 |
| 2020/0381361 | A1* | 12/2020 | Zhao | H01L 24/96 |

\* cited by examiner

*Primary Examiner* — Jay C Chang
(74) *Attorney, Agent, or Firm* — Schwabe, Williamson & Wyatt, P.C.

(57) ABSTRACT

Embodiments include semiconductor packages and methods to form the semiconductor packages. A semiconductor package includes a bridge with a hybrid layer on a high-density packaging (HDP) substrate, a plurality of dies over the bridge and the HDP substrate, and a plurality of through mold vias (TMVs) on the HDP substrate. The bridge is coupled between the dies and the HDP substrate. The bridge is directly coupled to two dies of the dies with the hybrid layer, where a top surface of the hybrid layer of the bridge is directly on bottom surfaces of the dies, and where a bottom surface of the bridge is directly on a top surface of the HDP substrate. The TMVs couple the HDP substrate to the dies, and have a thickness that is substantially equal to a thickness of the bridge. The hybrid layer includes conductive pads, surface finish, and/or dielectric.

16 Claims, 9 Drawing Sheets

(51) Int. Cl.
*H01L 23/31* (2006.01)
*H01L 21/48* (2006.01)
*H01L 21/56* (2006.01)
*H01L 21/683* (2006.01)

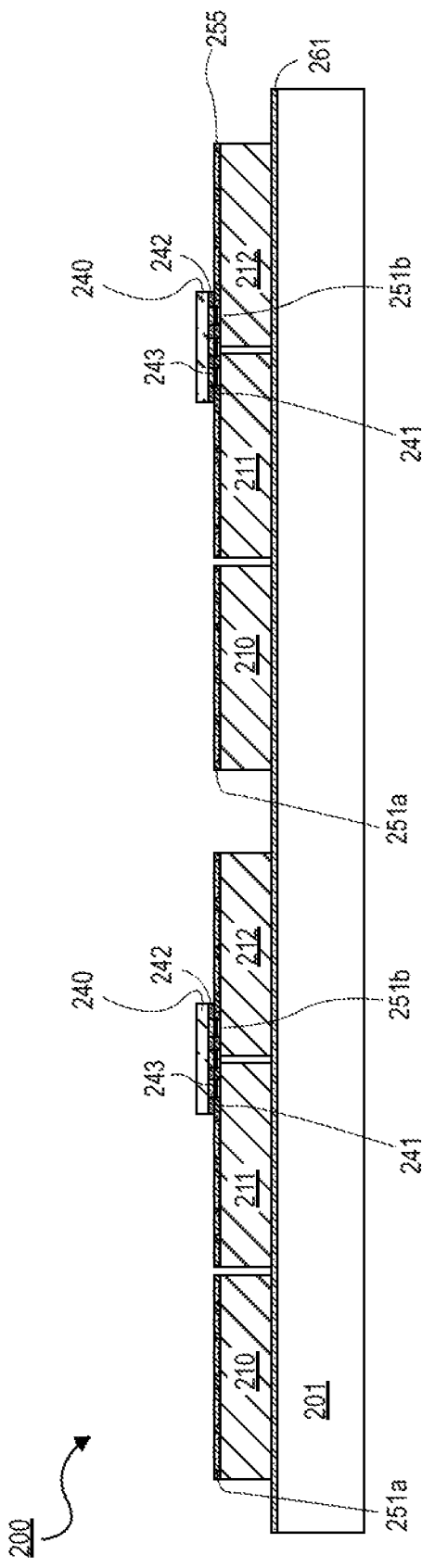
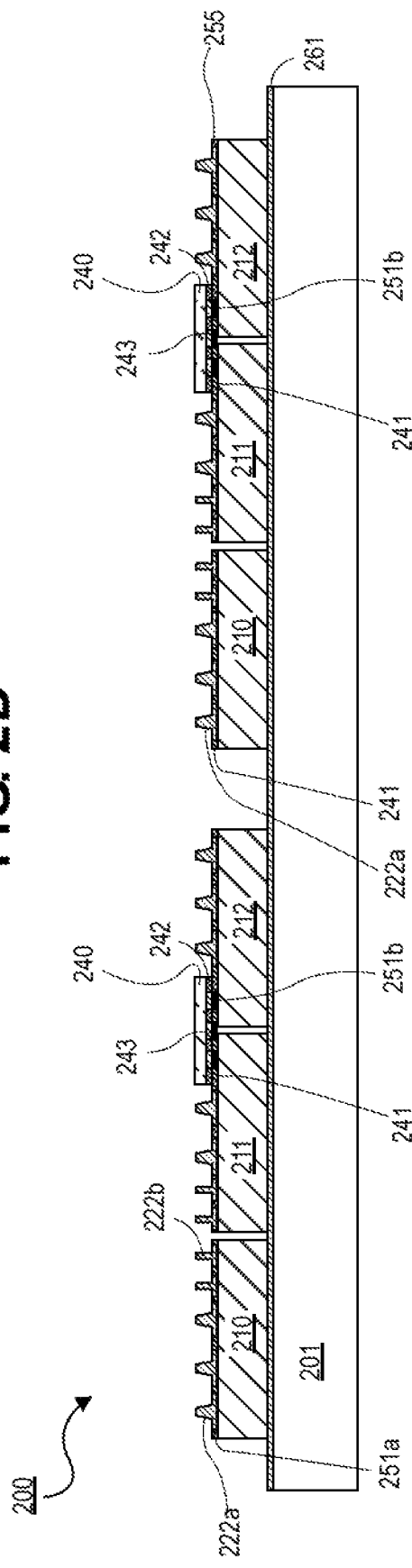
FIG. 2D
FIG. 2E

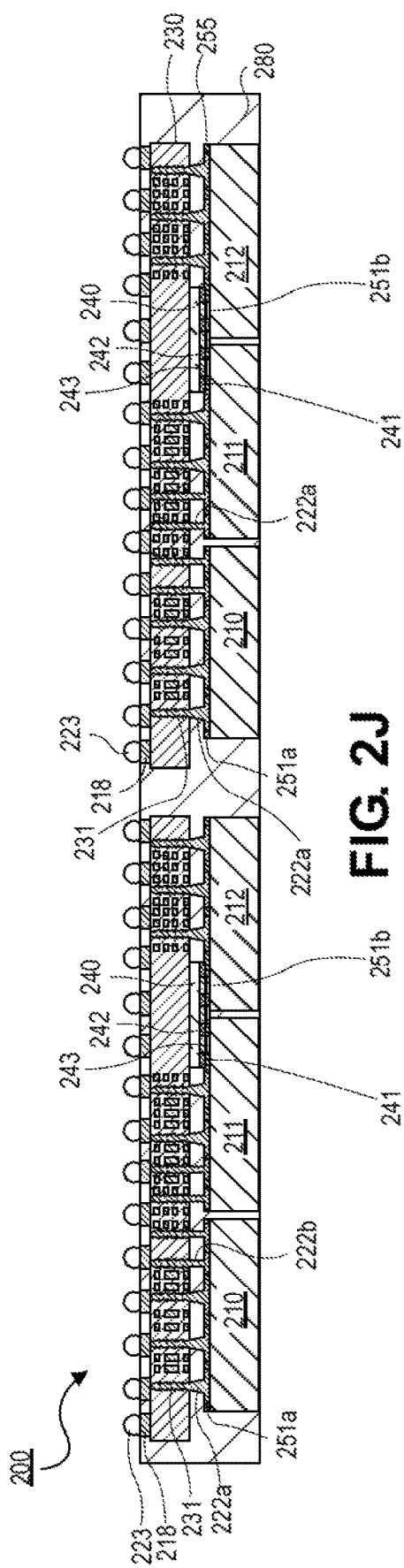
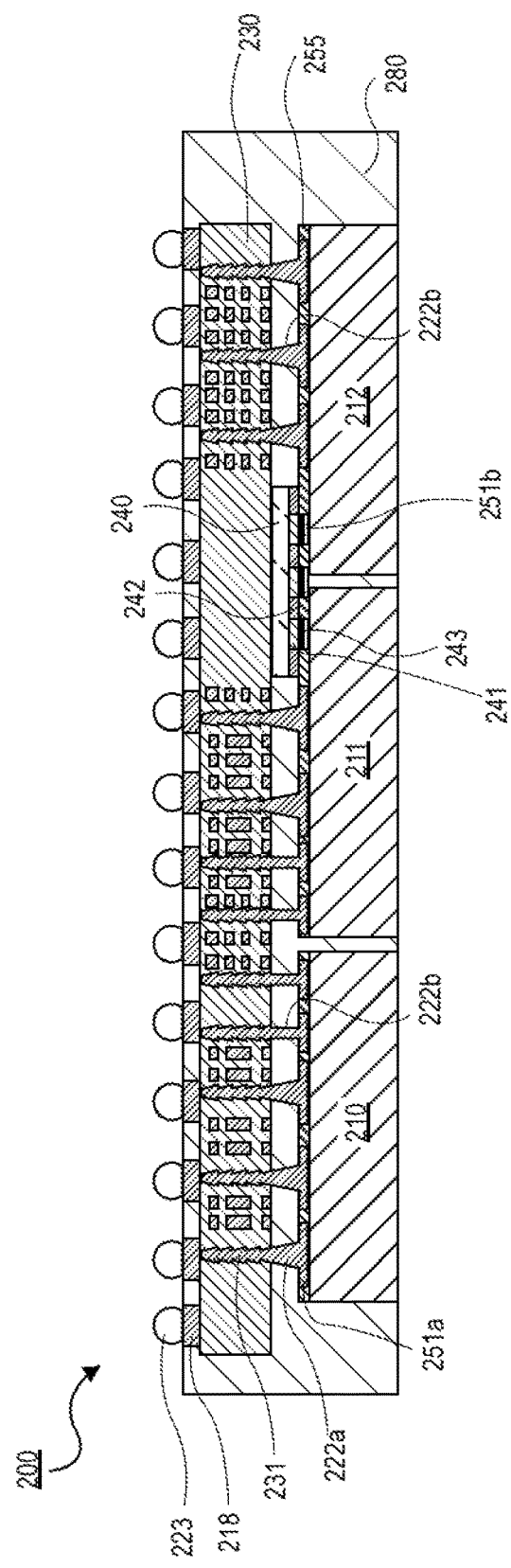
FIG. 2J
FIG. 2K

ULTRATHIN BRIDGE AND MULTI-DIE ULTRAFINE PITCH PATCH ARCHITECTURE AND METHOD OF MAKING

FIELD

Embodiments relate to packaging semiconductor devices. More particularly, the embodiments relate to semiconductor devices with package substrates that include ultrathin bridge and multi-die ultrafine pitch patch architectures.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs, while optimizing the performance of each device, however is not without issue.

For the data centric businesses, heterogeneous integration of multiple chips/dies in a package is essential. Interconnecting these chips at the lowest power and at high bandwidth density drives ultrafine line/space/via pads on package substrates. Recently, embedded bridge die technology addresses this need in server products. However, with ever increasing demands for multi-die interconnects, package substrates are required to embed extraneous bridge dies (e.g., greater than 10 bridge dies) to accommodate these multiple dies and multi-die interconnects. More importantly, the package assembly processes for such package substrates also require attaching multiple dies with solder to these extraneous bridge die areas, and desired results with high yields and increased bridge die bump pitches. Such processes, however, need additional assembly steps and time, and require precise control of substrate flatness over large areas of these packages.

This limits the bridge die bump pitches for solder-based embedded bridge die connections. These limitations on the bridge die bump pitches result in several major packaging issues including less than desired bump densities, which further results in increased interconnect physical areas in the die and increased costs for such increased silicon area. Furthermore, existing technologies have also used silicon interposers as an attempt to solve these pitch scaling limitations and issues. For multi-die architectures, silicon interposers can have sizes that exceed two-times (or more) the reticle size, which therefore requires stitching of reticles but with excessive costs and added complexities.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIGS. 2A-2L are illustrations of cross-sectional views of a process flow to form a semiconductor package with a plurality of dies, a HDP substrate, a thin bridge with a hybrid layer, a plurality of first and second TMVs, and a package substrate, according to some embodiments.

DETAILED DESCRIPTION

Figure 1:
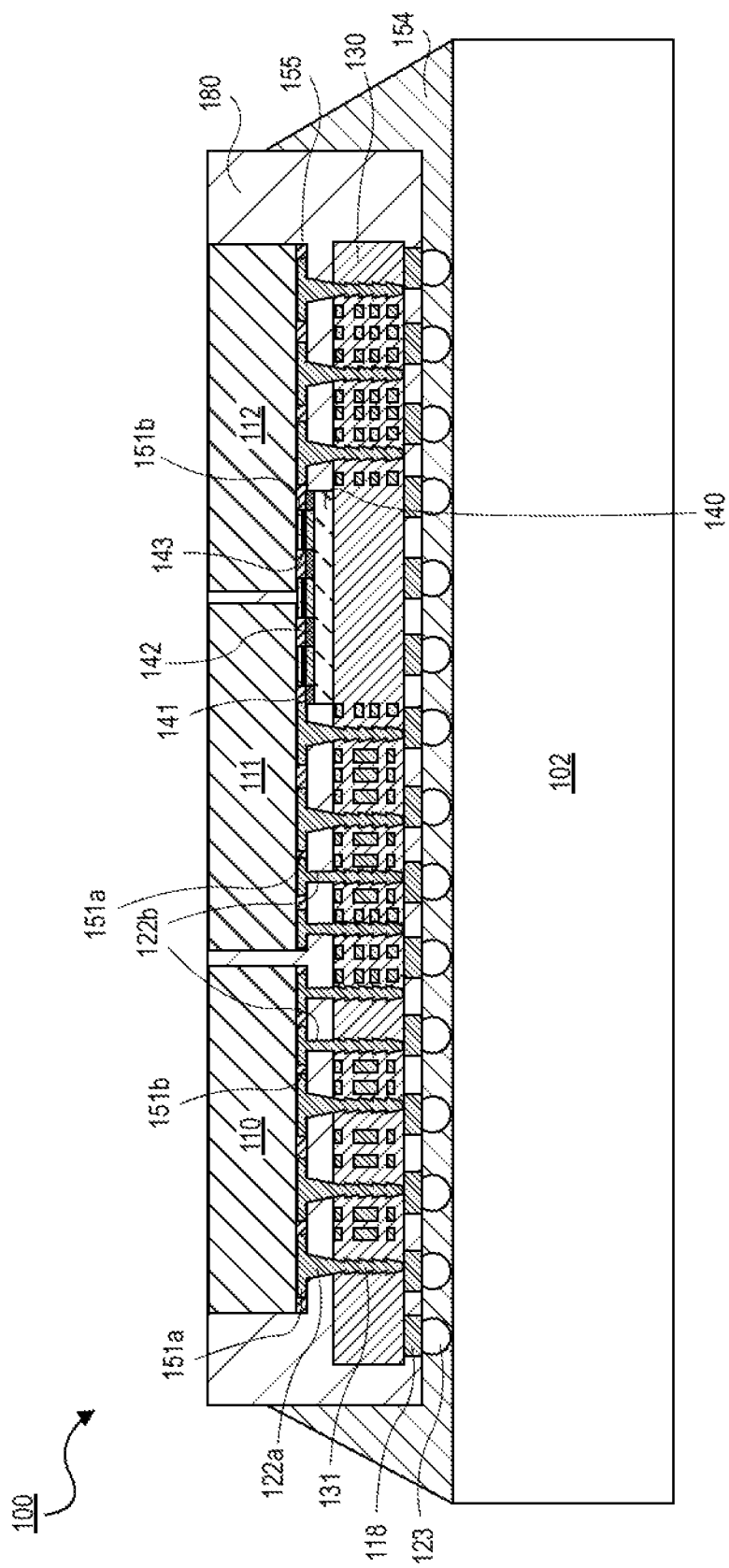
FIG. 1 is an illustration of a cross-sectional view of a semiconductor package with a plurality of dies, a high-density packaging (HDP) substrate, a thin bridge with a hybrid layer, a plurality of first and second through mold vias (TMVs), and a package substrate, according to one embodiment.

Described herein are semiconductor packages with package substrates and ultrathin (or thin) bridge and multi-die ultrafine pitch patch architectures and methods of forming such semiconductor packages. The semiconductor packages described below and methods of forming such semiconductor packages may include a plurality of dies, a high-density packaging (HDP) substrate, a thin bridge, a plurality of first through mold vias (TMVs), a plurality of second TMVs, and a package substrate, according to some embodiments. These embodiments of the semiconductor packages described herein combine the HDP substrate (e.g., a high-density (HD)-organic substrate) and the thin bridge (e.g., a thin embedded multi-die interconnect bridge (EMIB)) without solder balls/connections and to minimize number of bridges, and enables directly coupling (or attaching) the thin bridge between the HDP substrate and the dies with a hybrid dielectric/conducting bonding layer (e.g., a silicon dioxide/copper ($SiO_2$/Cu) bonding layer).

As used herein, a "bridge" may refer to a silicon interconnecting bridge or an interconnecting bridge made of any other substrate material that is suitable for forming such interconnecting bridge (e.g., an embedded multi-die interconnecting bridge (EMIB)). Accordingly, as used herein, a "thin bridge" (or an "ultrathin bridge") may refer to a bridge that may have a thickness of approximately 10 um-15 um and/or a thickness of approximately or less than 10 um. As described above, the thin bridge described herein does not need solder balls to be coupled to the dies, instead such thin bridge may be directly coupled (and/or communicatively coupled) to the dies with a hybrid layer (or a hybrid bonding layer). As used herein, a "hybrid layer" (or a hybrid bonding layer) may refer to a thin layer (or an ultrathin layer) comprised of a plurality of conductive pads (or Cu pads), a dielectric layer (or $SiO_2$ layer), and a surface finish layer (or tin (Sn) layer), where the dielectric layer may surround the conductive pads, where the top surfaces of the conductive pads are substantially coplanar to the top surface of the dielectric layer that is used to insulate the conductive pads, and where the surface finish layer may be disposed (or coated) directly on the top surfaces of the conductive pads.

For example, to directly couple the solder-less thin bridge to the dies with the hybrid layer, the thin bridge may dispose the Sn directly on the thin Cu pads of the thin bridge, where the Sn of the ultrathin bridge reacts directly with the Cu pads of the dies (i) to implement an Sn/Cu intermetallic compound between the thin bridge and the dies, and (ii) to directly lock (or bond in place) the thin bridge to the dies with a hybrid bonding process or the like. The hybrid bonding process may include temperature heating, pressure, and reducing atmosphere to implement the lock between the ultrathin bridge and the dies, in accordance with an embodiment. Note that, as described below, the hybrid layer may omit the surface finish layer based if desired.

The combined HDP substrate and thin bridge described herein help the semiconductor package by substantially reducing (or eliminating/mitigating) the total number of thin bridges that are typically needed as described above with existing technologies. The embodiments of the semiconductor packages described below enable improved routing and power delivery functions to the input/output (I/O) circuits such as the dies. The embodiments described herein also provide improved warpage benefits for the semiconductor package. For example, the semiconductor package may be implemented on a temporary glass carrier that substantially reduces the coefficient of thermal expansion (CTE) mismatch stresses, especially after an encapsulation layer (or a mold layer) processing step.

The embodiments described herein provide improvements to existing packaging solutions by eliminating the solder-based bridge interconnects (i.e., the bridges (or EMIBs) described herein may be coupled to another component without solder connections) to thereby provide improved bridge pitch scaling, reduced interconnect physical area on the dies, and lowered assembly costs. Also, another improvement to existing packaging solutions include eliminating the need for expensive silicon interposer to thereby reduce the overall package cost. These semiconductor packages further provide improvements to packaging solutions by implementing and combining solder-less bridge (or EMIB) interconnects, bridge-to-glass patch hybrid bonding (e.g., $SiO_2$/Cu bonding), HDP substrate routing layers with substantially reduced line/spacing (L/S) (e.g., L/S of less than 2/2), ultrafine lithographically-defined (litho) vias, and zero-misaligned via architectures.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, interne devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages with package substrates, dies, HDP substrates, thin bridges (or thin EMIBs) with hybrid layers, and TMVs with different widths.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Referring now to FIG. 1, a cross-sectional illustration of a semiconductor package 100 is shown, in accordance with an embodiment. In an embodiment, the semiconductor package 100 may include a plurality of dies 110-112, a HDP substrate 130, a thin bridge 140 with a hybrid layer 141-143, a plurality of TMVs 122a-b, and a package substrate 102. For one embodiment, the semiconductor package 100 may combine (or stack) the dies 110-112, the thin bridge 140, and the HDP substrate 130, where the thin bridge 140 may be directly coupled (or attached) between the HDP substrate 130 and the dies 110-112 with the hybrid layer 141-143, and where the hybrid layer 141-143 is comprised of a plurality of conductive pads 141 (or Cu pads), a dielectric layer 142 (a $SiO_2$ layer), and a surface finish layer 143 (a Sn layer or a bare Cu surface layer) (i.e., a hybrid dielectric/conducting bonding layer).

That is, according to some embodiments, the dies 110-112 may be disposed over the HDP substrate 130 and the thin bridge 140, and the thin bridge 140 may be directly disposed below and between the dies 110-112, while the HDP substrate 130 may be disposed over the package substrate 102. Note that, while one HDP substrate 130, one thin bridge 140, and three dies 110-112 are illustrated in FIG. 1, it is to be appreciated that any number of HDP substrates 130, thin bridges 140, and dies 110-112 may be combined/stacked with, disposed on/over, and coupled to the package substrate 102.

For one embodiment, the package substrate 102 may include, but is not limited to, a package, a substrate, a printed circuit board (PCB), and/or a motherboard. For one embodiment, the package substrate 102 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer may be a photosensitive dielectric layer. For one embodiment, the PCB 102 may include a plurality of conductive layers, which may further include copper (or metallic) traces, lines, pads, vias, via pads, holes, and/or planes.

As shown in FIG. 1, the HDP substrate 130 may be disposed over the package substrate 102, where the HDP substrate 130 may be conductively coupled to the package substrate 102 with a plurality of solder balls 123. In some embodiments, the HDP substrate 130 may include a plurality of redistribution layers (RDLs) comprised of traces with L/S of approximately or less than 2/2 um, litho vias, zero-misalignment vias, and/or via pads with thicknesses of approximately or less than 18 um. The HDP substrate 130 may be a silicon substrate having increased (or high) input/output (I/O) density and bandwidth for the communication with the dies 110-112 and/or the thin bridge 140. In one embodiment, the HDP substrate 130 may have a thickness of approximately 10 um to 200 um.

In one embodiment, the HDP substrate 130 may have a plurality of first conductive pads 118 and a plurality of conductive interconnects 131. The first conductive pads 118 may be disposed on the bottom surface of the HDP substrate 130. In one embodiment, the first conductive pads 118 may have a pitch of greater than approximately 80 um. The first conductive pads 118 may be a plurality of ball-grid array (BGA) pads or the like. The conductive interconnects 131 of the HDP substrate 130 may include vias, traces, lines, pads, or the like. For example, the conductive interconnects 131 may be directly coupled to the first conductive pads 118, where the solder balls 123 may be conductively couple the first conductive pads 118 of the HDP substrate 130 to the top surface of the package substrate 102.

The conductive interconnects 131 may extend vertically from the bottom surface to the top surface of the HDP substrate 130. For example, the bottom surfaces of the conductive interconnects 131 of the HDP substrate 130 may be directly coupled to the first conductive pads 118, where the bottom surfaces of the conductive interconnects 131 may be substantially coplanar to the bottom surface of the HDP substrate 130. Meanwhile, in another example, the top surfaces of the conductive interconnects 131 of the HDP substrate 130 may be directly coupled to a plurality of TMVs 122a-b, where the top surfaces of the conductive interconnects 131 may be substantially coplanar to the top surface of the HDP substrate 130.

For one embodiment, the thin bridge 140 may be directly disposed over/on the HDP substrate 130, where the bottom surface of the thin bridge 140 may be directly coupled to the top surface of the HDP substrate 130. In one embodiment, the thin bridge 140 may include the hybrid layer 141-143 comprised of the conductive pads 141, the dielectric layer 142, and the surface finish layer 143. In one embodiment, the conductive pads 141 may be a plurality of Cu pads or the like. For one embodiment, the dielectric layer 142 may be a passivation layer formed of a $SiO_2$ material and/or any known dielectrics/insulating materials or the like that insulate the conductive pads 141. Furthermore, as described above in one embodiment, the surface finish layer 143 may include one or more conductive materials that may provide extra solder such as tin or the like. For example, the conductive pads 141 and the dielectric layer 142 may be disposed directly on the top surface of the thin bridge 140, where the dielectric layer 142 surrounds the conductive pads 141. Furthermore, the top surfaces of the conductive pads 141 may be substantially coplanar to the top surface of the dielectric layer 142, where the surface finish layer 143 may be disposed directly on the top surfaces of the conductive pads 141.

For one embodiment, the thin bridge 140 may have a thickness of approximately 10 um to 15 um. In another embodiment, the thin bridge 140 may have a thickness of approximately or less than 10 um. For one embodiment, the conductive pads 141 and the dielectric layer 142 of the bridge 140 may have a thickness of approximately 5 um. In another embodiment, the conductive pads 141 and the dielectric layer 142 of the bridge 140 may have a thickness of approximately or less than 10 um. For one embodiment, the surface finish layer 143 of the bridge 140 may have a thickness of approximately 1 um to 2 um. In another embodiment, the surface finish layer 143 of the bridge 140 may have a thickness of approximately or less than 5 um. Note that, in some alternative embodiments, the surface finish layer 143 may be omitted as shown in FIG. 2C. As such, in one embodiment, the hybrid layer 141-143 may have a thickness of approximately 5 um to 7 um; while, in another embodiment, the hybrid layer 141-143 may have a thickness of approximately or less than 7 um.

Additionally, as shown in FIG. 1, the TMVs 122a-b may be directly disposed on/over and coupled to the top surfaces of the conductive interconnects 131 of the HDP substrate 130. For example, the TMVs 122a-b may extend vertically from the top surfaces of the conductive interconnects 131 of the HDP substrate 130 to approximately the bottom surfaces of the dies 110-112 (or the bottom surfaces of a plurality of second conductive pads 151a-b of the dies 110-112). Note that, in some embodiments, the TMVs 122a-b may not be directly (or perfectly) aligned on the conductive interconnects 131 of the HDP substrate 130.

In one embodiment, the TMVs 122a-b may be formed of a conductive material such as Cu or the like. The TMVs 122a-b may be formed with a litho process (or the like) as the TMVs 122a-b may be electrolessly grown, encapsulated with mold, and subsequently planarized. Additionally, the TMVs 122a-b may have a plurality of first TMVs 122a and a plurality of second TMVs 122b. In one embodiment, the first TMVs 122a may have a width that is greater than a width of the second TMVs 122b. Moreover, in some embodiments, the first TMVs 122a may have tapered sidewalls, while the second TMVs 122b may have substantially vertical sidewalls and/or may have an angle for slight tapered sidewalls that are substantially less than an angle of the tapered sidewalls of the first TMVs 122a).

For some embodiments, the TMVs 122a-b may surround the thin bridge 140. In an embodiment, the thin bridge 140 may communicatively couple the first die 110, the second die 111, the third die 112, and/or the HDP substrate 130. As shown in FIG. 1, the thin bridge 140 may be directly coupled to the dies 111-112. Note, however, that the thin bridge 140 may be coupled to any of the two or more dies 110-112. In an embodiment, the thin bridge 140 may comprise electrical routing (or interconnect structures (e.g., through silicon vias (TSVs)) to communicative couple the second die 111 to the third die 112 with the conductive pads 141 and/or the surface finish layer 143. As described above, the thin bridge 140 does not need solder balls to be directly coupled to the dies 111-112, instead the thin bridge 140 may be directly coupled to the dies 111-112 with the hybrid layer comprised of the conductive pads 141, the dielectric layer 142, and the surface finish layer 143. In some embodiments, the thin bridge 140 may be referred to as an EMIB. For additional embodiments, the thin bridge 140 may include a plurality of TSVs that may be further used to couple the thin bridge 140 to the dies 111-112 and/or the HDP substrate 130.

As shown in FIG. 1, the dies 110-112 may include the first die 110, the second die 111, and the third die 112. The first, second, and third dies 110-112 may be disposed over the HDP substrate 130. The second and third dies 111-112 may be disposed over both the HDP substrate 130 and the thin bridge 140. In some embodiments, the dies 110-112 may include the second conductive pads 151a-b and a dielectric layer 155. Both the second conductive pads 151a-b and the dielectric layer 155 may be disposed directly on the bottom surfaces of the dies 110-112, where the dielectric layer 155 may surround the second conductive pads 151a-b.

In one embodiment, the second conductive pads 151a-b may be a plurality of Cu pads or the like. For one embodiment, the dielectric layer 155 may be a passivation layer formed of a $SiO_2$ material and/or any known dielectrics/insulating materials or the like that insulate the second conductive pads 151a-b. For one embodiment, the dies 110-112 may have a thickness of approximately or greater than 200 um. In another embodiment, the dies 110-112 may have a thickness of approximately or less than 200 um. For one embodiment, the conductive pads 151a-b and the dielectric layer 155 of the dies 110-112 may have a thickness of approximately 2 um. In another embodiment, the conductive pads 151a-b and the dielectric layer 155 of the dies 110-112 may have a thickness of approximately or less than 5 um.

In one embodiment, the second conductive pads 151a-b may include a plurality of second conductive pads 151a and a plurality of second conductive pads 151b. In these embodiments, the second conductive pads 151a may have a width that is greater than a width of the second conductive pads 151b. For example, the first TMVs 122a may conductive couple the second conductive pads 151a of the dies 110-112 to the conductive interconnects 131 of the HDP substrate 130. Likewise, the second TMVs 122b may conductive couple the second conductive pads 151b of the first and second dies 110-111 to the conductive interconnects 131 of the HDP substrate 130, while the second conductive pads 151b of the second and third dies 111-112 may be directly coupled onto the surface finish layer 143 and the conductive pads 141 of the thin bridge 140.

For one embodiment, the dies 110-112 may include, but are not limited to, a semiconductor die, an electronic device (e.g., a wireless device), an integrated circuit (IC), a central processing unit (CPU), a microprocessor, a platform controller hub (PCH), a memory (e.g., a high-bandwidth memory (HBM)), and/or a field-programmable gate array (FPGA). The dies 110-112 may be formed from a material such as silicon and have circuitry thereon that is to be coupled to the HDP substrate 130 and the thin bridge 140.

For one embodiment, an encapsulation layer 180 may be disposed over the dies 110-112 with the second conductive pads 151a-b and the dielectric layer 155, the TMVs 122a-b, the thin bridge 140 with the conductive pads 141, the dielectric layer 142, and the surface finish layer 143, and the HDP substrate 130 with the first conductive pads 118. As such, the TMVs 122a-b may be surrounded with the encapsulation layer 180, and may extend vertically through the encapsulation layer 180 to conductive couple the HDP substrate 130 to the dies 110-111. In one embodiment, the encapsulation layer 180 may include one or more encapsulation materials such as a mold material, an underfill material, a filler material, any similar material(s), and/or any combination thereof. For one embodiment, the encapsulation layer 180 may be planarized as the top surface of the encapsulation layer 180 may be substantially coplanar to the top surfaces of the dies 110-112, where the encapsulation layer 180 may also be disposed between the dies 110-112. Also, the encapsulation layer 180 may be disposed over an underfill material 154 (or an underfill layer). In one embodiment, the underfill material 154 may be disposed over the package substrate 102, where the underfill material 154 is disposed between the top surface of the package substrate 102 and the bottom surfaces of the encapsulation layer 180 and the first conductive pads 118. The underfill material 154 may surround (or embed) portions of the encapsulation layer 180 and the solder balls 123 that are disposed between the encapsulation layer 180 and the package substrate 102.

In additional embodiments, a thermal solution (or thermal device) may be disposed over the top surfaces of the dies 110-112 and/or the encapsulation layer 180, where the thermal solution may include a heatsink, an integrated heat spreader (IHS), a manifold, a cold plate, or the like.

Note that the semiconductor package 100 may include fewer or additional packaging components based on the desired packaging design.

FIGS. 2A-2L are illustrations of cross-sectional views of a process flow to form a semiconductor package 200, in accordance with an embodiment. In an embodiment, the semiconductor package 200 may include a plurality of dies 210-212, a HDP substrate 230, a thin bridge 240 with a hybrid layer 241-243, a plurality of TMVs 222a-b, and a package substrate 202, according to some embodiments. The process flow illustrated in FIGS. 2A-2L forms the semiconductor package 200 that is substantially similar to the semiconductor package 100 described above in FIG. 1. Likewise, the components of the semiconductor package 200 are substantially similar to the components of the semiconductor package 100 described above in FIG. 1. Accordingly, as described above, the process flow of the package substrate 200 illustrates one of the approaches to combine the dies 210-212, the thin bridge 240, and the HDP substrate 230 as the thin bridge 240 may be directly coupled between the HDP substrate 230 and the dies 210-212 with the hybrid layer 241-243—without solder connections—with ultrafine interconnecting/routing pitches using the TMVs 222a-b and the conductive pads 255a-b.

Figure 2A:
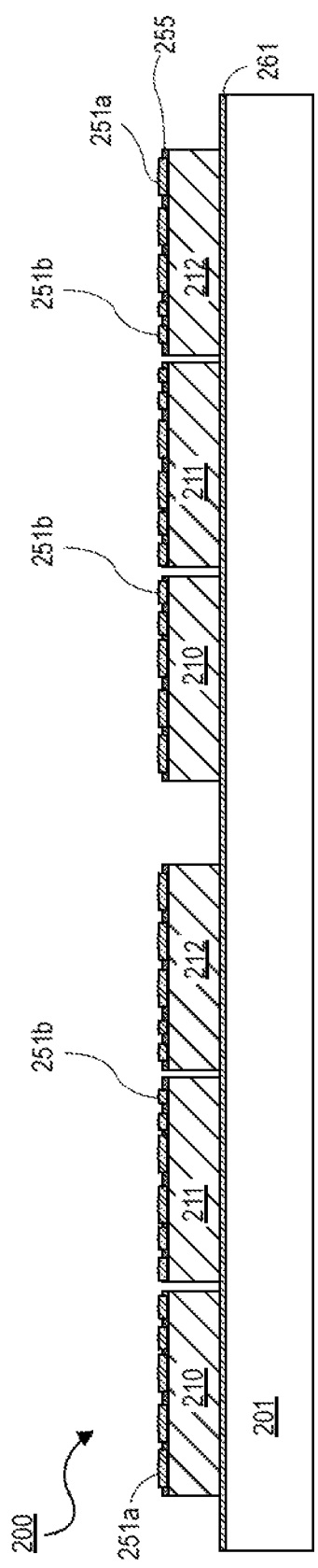

Referring now to FIG. 2A, a cross-sectional illustration of a semiconductor package 200 is shown, in accordance with an embodiment. In an embodiment, the semiconductor package 200 may include an adhesive layer 261 (or an adhesive film, a bonding film, etc.) disposed on a carrier 201. For one embodiment, the carrier 201 may be a glass carrier (or a temporary glass panel carrier), a metal carrier, and/or any similar flat and rigid carrier/substrate.

Additionally, in one embodiment, a plurality of dies 210-212 may be disposed over the adhesive layer 261 and the carrier 201, where the dies 210-212 may be positioned adjacent to each other and coupled to the carrier 201 with the adhesive layer 261. For example, the dies 210-212 may be disposed adjacent to each other with a die-to-die spacing of approximately or less than 50 um. Furthermore, as shown in FIG. 2A, the top surfaces of the dies 210-212 may be directly disposed on the adhesive layer 261 to couple the dies 210-212 to the carrier 201. The dies 210-212 may be substantially similar to the dies 110-112 described above in FIG. 1. As such, the dies 210-212 may have a plurality of second conductive pads 251a-b and a dielectric layer 255, where the width of the second conductive pads 251a may be greater than the width of the second conductive pads 251b.

Furthermore, as shown in FIG. 2A, the top surfaces of the second conductive pads 251a-b may protrude over the top surface of the dielectric layer 255. For example, the second conductive pads 251a-b may be over-plated with a thickness of approximately 2 um to 3 um above the thickness of the dielectric layer. Additionally, in one embodiment, the second conductive pads 251b may have a pitch of approximately or less than 5 um, which may be implemented for the bridge interface and the HD interconnects (e.g., the TMVs 222b of FIG. 2E). While, in another embodiment, the second conductive pads 251a may have a pitch of approximately or greater than 25 um, which may be implemented for the non-bridge interface. These over-plated second conductive pads 251a-b help mitigate the thickness variations between the dies 210-212, where the thickness of the dielectric layer 255 may also be adjusted (or selected) to accommodate such thickness variations between the dies 210-212.

Figure 2B:
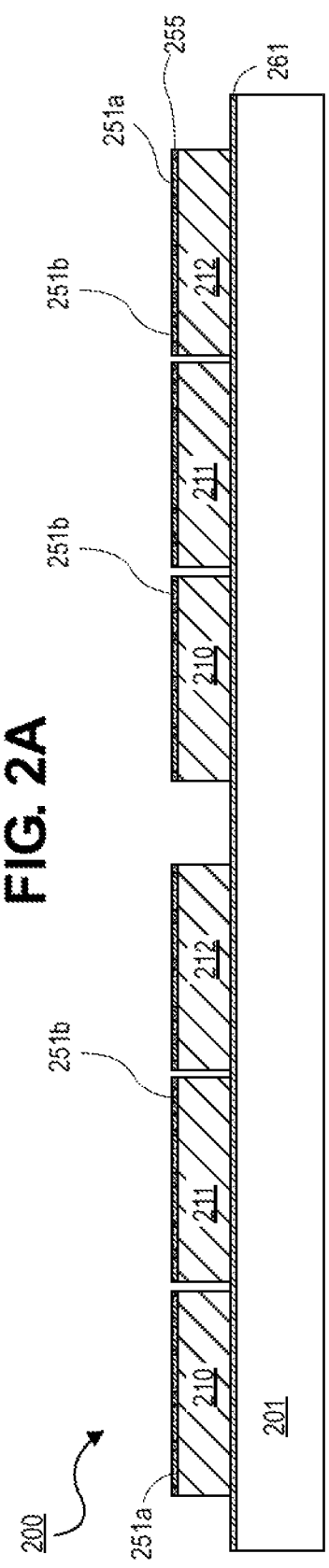
Figure 2C:

Referring now to FIG. 2B, a cross-sectional illustration of a semiconductor package 200 is shown, in accordance with an embodiment. In an embodiment, the over-plated second conductive pads 251a-b may be planarized so that the top surfaces of the second conductive pads 251a-b are substantially coplanar with the top surface of the dielectric layer 255. This planarization process also enables the second conductive pads 251a-b to have substantially the same thicknesses as each other, thereby reducing any thickness variation for the semiconductor package 200.

In an embodiment, the planarization may be implemented with a chemical mechanical planarization (CMP) process or the like. The planarization process may have a high degree of accuracy due to the presence of the dielectric layer 255 that serves as a stopping point. After the second conductive pads 251a-b are planarized, the exposed top surfaces of the second conductive pads 251a-b may be substantially coplanar to the top surface of the dielectric layer 255—but with a slight depression. For example, the second conductive pads 251a-b may be selectively etched to create a slight depression (or an under-etch) of approximately or less than 0.5 um below the top surface of the dielectric layer 255, where this slight depression helps the bridge (e.g., the bridge 240 of FIG. 2D) to stay locked in place with the second and third dies 211-212 as described above and shown below in FIG. 2D.

Referring now to FIG. 2C, a cross-sectional illustration of a semiconductor package 200 is shown, in accordance with an embodiment. In an embodiment, a plurality of thin bridges 240 may be disposed directly on the second and third dies 211-212 (as shown below in FIG. 2D). The thin bridge 240 may be substantially similar to the thin bridge 140 described above in FIG. 1. Accordingly, in one embodiment, the thin bridge 240 may include a hybrid layer 241-243 (as shown with the thin bridge 240 on the right-side of FIG. 2C), where the hybrid layer 241-243 is comprised of a plurality of conductive pads 241, a dielectric layer 242, and a surface finish layer 243 (e.g., the hybrid layer 241-243 may include a combination of $Cu/SiO_2/Sn$ or the like). In one embodiment, the conductive pads 241 and the dielectric layer 242 may be planarized over the thin bridge 240 with a fly-cut process or the like. Subsequently, in these embodiments, the surface finish layer 243 may then be disposed directly over the exposed top surfaces of the conductive pads 241 with a Sn coating process or the like (e.g., the Sn coating process may be implemented with immersion Sn plating, electroplating, and/or the like). Also, note, as shown in FIG. 2C, the surface finish layer 243 may protrude over the top surface of the dielectric layer 242.

In an alternate embodiment, the thin bridge 240 may include a hybrid layer 241'-242' (as shown with the thin bridge 240 on the left-side of FIG. 2C), where the hybrid layer 241'-242' is comprised of a plurality of conductive pads 241' and a dielectric layer 242'. The hybrid layer 241'-242' may be substantially similar to the hybrid layer 241-243—after omitting the surface finish layer 243.

Referring now to FIG. 2D, a cross-sectional illustration of a semiconductor package 200 is shown, in accordance with an embodiment. For one embodiment, the thin bridge 240 with the hybrid layer 241-243 may be disposed over the second and third dies 211-212. In an embodiment, the thin bridge 240 may be precisely positioned with the hybrid layer 241-243 facing down onto the second conductive pads 251b of the second and third dies 211-212 (i.e., onto the fine pitch conductive (or Cu) pads (with slight depressions)). In these embodiments, the surface finish layer 243 and the conductive pads 241 of the thin bridge 240 may be a plurality of Sn coated Cu pads. For one embodiment, the Sn coated Cu pads of the thin bridge 240 may be precisely placed on the second conductive pads 251b of the second and third dies 211-212 with a precise pick-and-place tool (or the like). Furthermore, as described above, a hybrid bonding process (or a $Cu/SiO_2$—$Cu/SiO_2$ hybrid bonding process) may be implemented on the Sn coated Cu pads of the thin bridge 240 as the Sn coated Cu pads are heated at approximately 240° C.-250° C. to create a Cu—Sn—Cu intermetallic bond between the conductive pads 241 of the thin bridge 240 and the respective second conductive pads 251b of the second and third dies 211-212. Accordingly, in these embodiments, the Cu—Sn—Cu intermetallic bond may lock (or firmly hold in place) the thin bridge 240 onto the second and third dies 211-212.

Referring now to FIG. 2E, a cross-sectional illustration of a semiconductor package 200 is shown, in accordance with an embodiment. In an embodiment, a litho patterning and plating process (or the like) may be implemented to dispose (or plate/form) a plurality of TMVs 222a-b directly on the respective second conductive pads 251a-b of the dies 210-212. The litho process may include several steps as described below. For example, a seed layer may be disposed over the exposed top surfaces of the second conductive pads 251a-b and the dielectric layer 255 of the dies 210-212. In one embodiment, the seed layer may include copper, titanium, any combination thereof, and/or the like. The seed layer may be formed with a sputtering process or the like.

After the seed layer disposition, in one embodiment, a resist layer may be disposed over the seed layer. In an embodiment, the resist layer may be a dry-film resist (DFR) or the like. In an embodiment, the resist layer may be patterned (or exposed/developed) to form via openings with a litho process, a laser drilling process, or the like. The via openings may expose the top surfaces of the second conductive pads 251a-b of the dies 210-212 in the non-bridge interface (or portion/region).

In some embodiments, a conductive material (e.g., Cu) may disposed (or plated) into the via openings to form the TMVs 222a-b (or litho vias that may be electrolessly grown, subsequently encapsulated with mold, and planarized) respectively on the exposed top surfaces of the second conductive pads 251a-b of the dies 210-212. The TMVs 222a-b may be referred to as conductive pillars/interconnects. The TMVs 222a-b may be substantially similar to the TMVs 122a-b described above in FIG. 1. In an embodiment, the TMVs 222 may be over-plated over the top surface of the resist layer in order to ensure complete filling of the via openings in the resist layer. For one embodiment, the TMVs 222a-b may vertically extend from the second conductive pads 251a-b to/over the top surface of the resist layer. In an embodiment, the TMVs 222a-b may be formed with an electroplating process or the like.

In an embodiment, when the TMVs 222a-b are over-plated, the over-plated TMVs 222a-b may be planarized so that the top surfaces of the TMVs 222a-b are substantially coplanar with the top surface of the resist layer. This planarization process also enables the TMVs 222*a-b* to have substantially the same thicknesses as each other, thereby reducing any thickness variation for the semiconductor package 200. For example, after the TMVs 222*a-b* are planarized, the exposed surfaces of the TMVs 222*a-b* may be substantially coplanar with the exposed surface of the bridge 240. In an embodiment, the planarization may be implemented with a CMP process or the like. The planarization process may have a high degree of accuracy due to the presence of the resist layer that serves as a stopping point. Lastly, the resist layer may be stripped with any suitable process, such as ashing, wet stripping, or the like. After removing the resist layer, portions of the seed layer may be exposed. As such, the exposed seed layer may be etched with an etching process or the like.

Figure 2F:
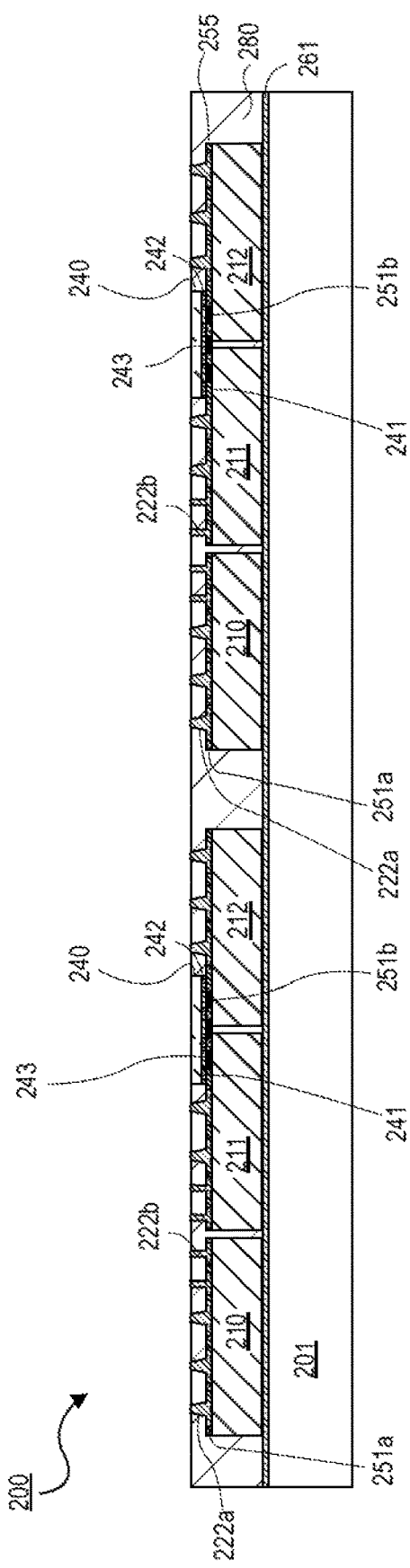

Referring now to FIG. 2F, a cross-sectional illustration of a semiconductor package 200 is shown, in accordance with an embodiment. For one embodiment, an encapsulation layer 280 may be disposed over the TMVs 222*a-b*, the thin bridge 240 with the dielectric layer 242, the dies 210-212 with the conductive pads 251*a-b* and the dielectric layer 255, and the adhesive layer 261. In an embodiment, the encapsulation layer 280 may be disposed to cover the top surfaces of the TMVs 222*a-b*. In one embodiment, the encapsulation layer 280 may be a mold layer and/or any similar encapsulation material(s). For one embodiment, the mold layer 280 may include an epoxy (e.g., a soft epoxy, a stiff epoxy, opaque epoxy, etc.) with one or more filler materials. In an embodiment, the encapsulation layer 280 may be compression molded, laminated, or the like.

The encapsulation layer 280 may be substantially similar the encapsulation layer 180 described above in FIG. 1. In an embodiment, the encapsulation layer 280 may be planarized (or grinded) so that the top surfaces of the TMVs 222*a-b* are substantially coplanar with the top surfaces of the encapsulation layer 280 and/or the bridge 240. Additionally, the encapsulation layer 280 is planarized/grinded to expose the top surfaces of the TMVs 222*a-b* and/or the bridge 240. In an embodiment, the planarization may be implemented with a CMP process or the like.

Figure 2G:
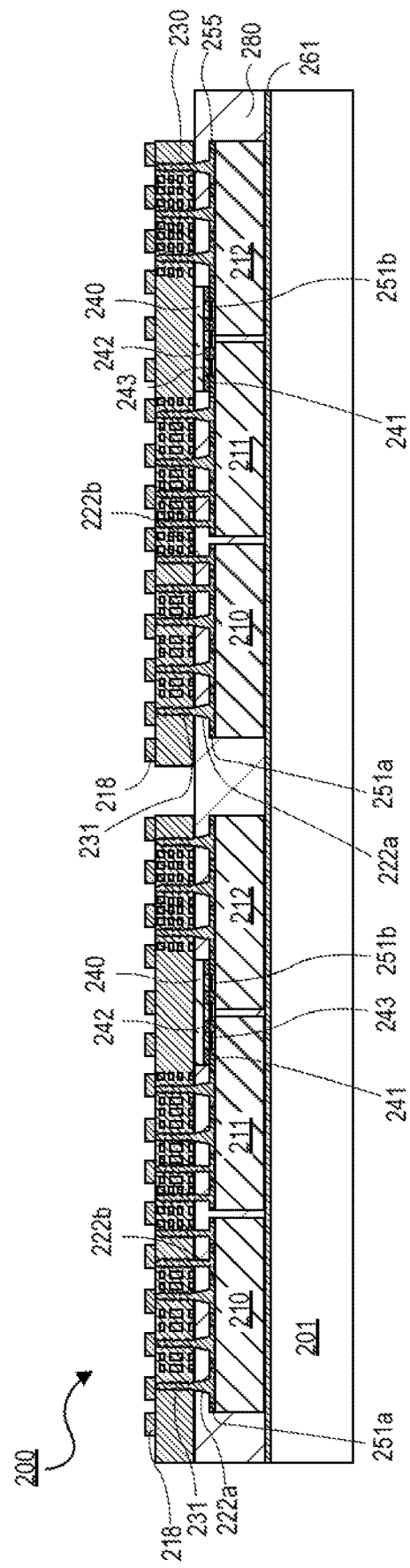

Referring now to FIG. 2G, a cross-sectional illustration of a semiconductor package 200 is shown, in accordance with an embodiment. In an embodiment, a HDP substrate 230 may be disposed over the top surfaces of the encapsulation layer 280, the TMVs 222*a-b*, and the bridge 240. As such, the bridge interface of the HDP substrate 230 may be directly disposed on the exposed surface of the bridge 240, thereby the bridge 240 with the hybrid layer 241-243 is sandwiched between the dies 211-212 and the HDP substrate 230. The HDP substrate 230 may be substantially similar to the HDP substrate 130 described above in FIG. 1. As such, the HDP substrate 230 may include a plurality of conductive interconnects 231 and a plurality of first conductive pads 218. The conductive interconnects 231 of the HDP substrate 230 may conductively couple the TMVs 222*a-b* and the dies 210-212 to the first conductive pads 218.

In one embodiment, the first conductive pads 218 may be disposed (or plated) on the top surface of the HDP substrate 230 with a litho process as described above. Note that, after the semiconductor package 200 is flipped as shown in FIG. 2L, the first conductive pads 218 are eventually positioned below the HDP substrate 230, coupled to the bottom surface of the HDP substrate 230, and similar to the first conductive pads 118 described above in FIG. 1. For one embodiment, the HDP substrate 230 may include one or more RDL layers with conductive traces (or lines) having an L/S of approximately or less than 2/2, litho vias, zero-misalignment vias, and/or approximately or less than 18 um via pads. In one embodiment, the first conductive pads 218 of the HDP substrate 230 may have a pitch of approximately or greater than 80 um.

Figure 2H:
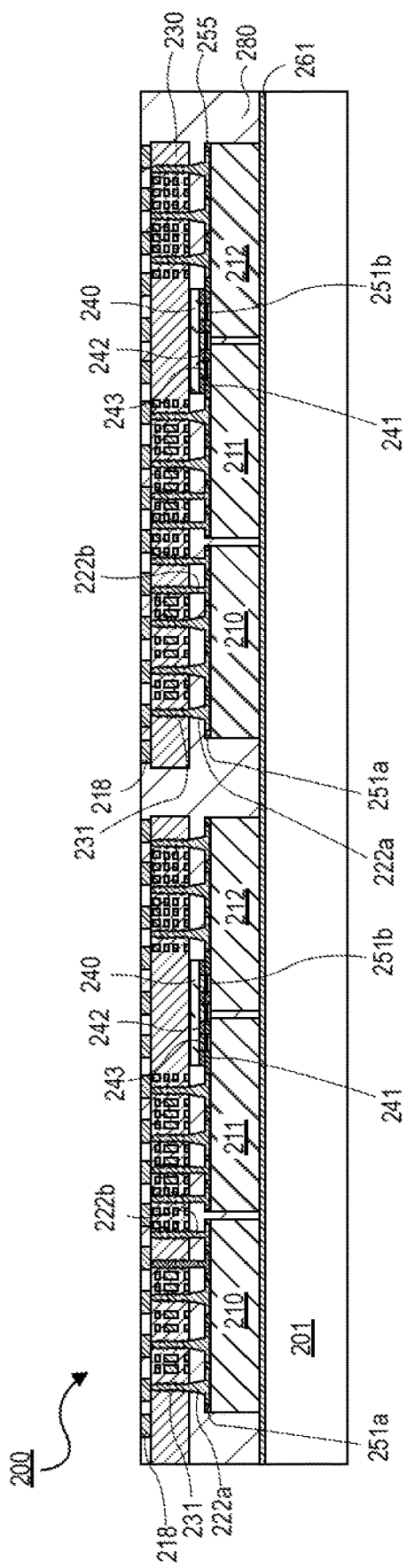

Referring now to FIG. 2H, a cross-sectional illustration of a semiconductor package 200 is shown, in accordance with an embodiment. In an embodiment, the encapsulation layer 280 may be further disposed over the first conductive pads 218, the HDP substrate 230, and the existing encapsulation layer 280 to fully surround (or enclose/embed) the HDP substrate 230, the bridge 240, and the dies 210-212. The encapsulation layer 280 may be substantially similar to the encapsulation layer 280 described above in FIG. 2F. Additionally, in one embodiment, the encapsulation layer 280 may be planarized to expose the top surfaces of the first conductive pads 218, where the top surfaces of the first conductive pads 218 may be substantially coplanar to the top surface of the encapsulation layer 280. As described above, the encapsulation layer 280 may be planarized with a CMP process or the like.

Figure 2I:
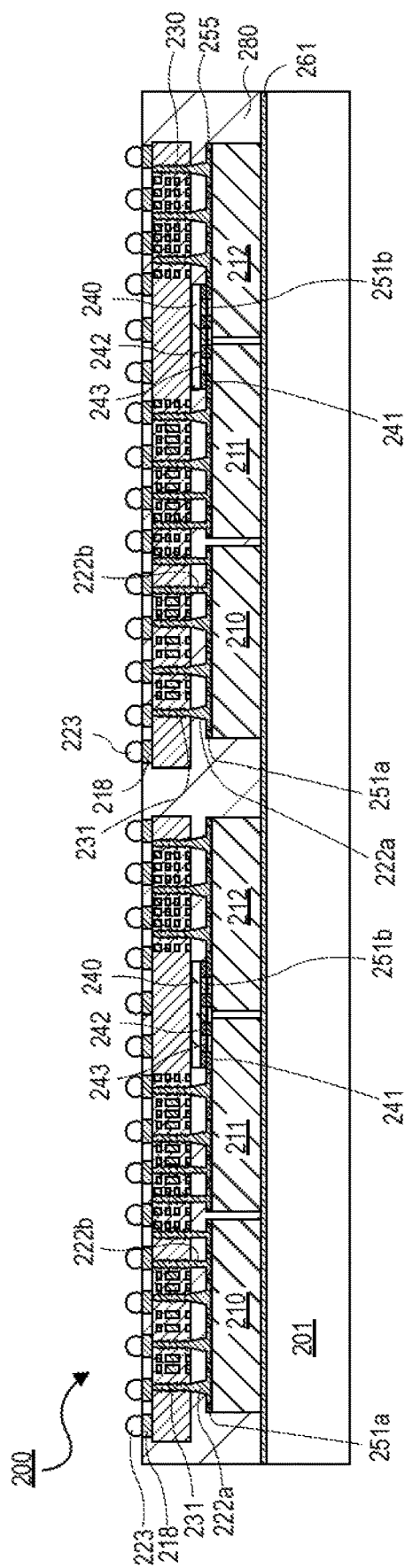
Figure 2L:
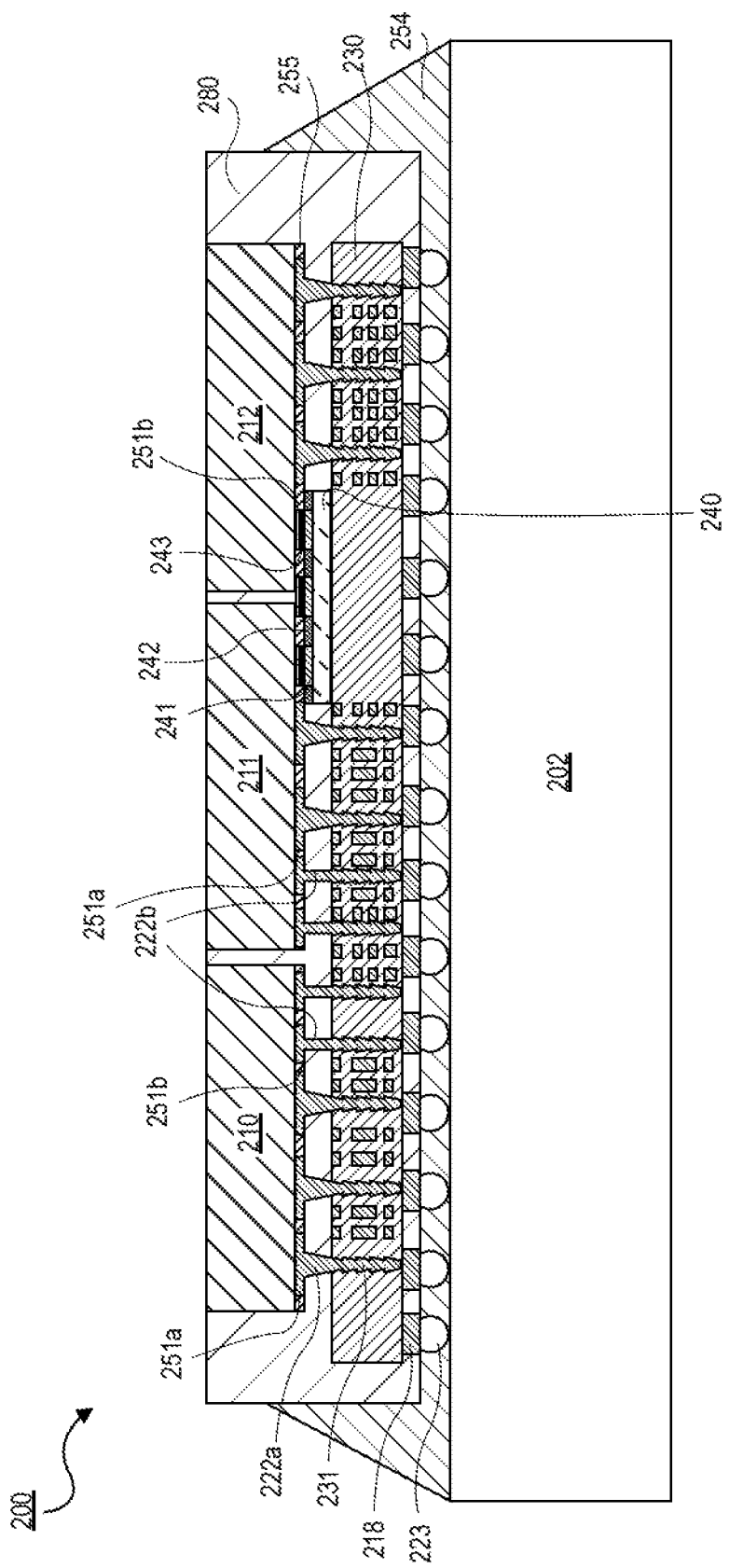

Referring now to FIG. 2I, a cross-sectional illustration of a semiconductor package 200 is shown, in accordance with an embodiment. In one optional embodiment, a plurality of solder balls 223 may be directly disposed onto and coupled to the exposed surfaces of the first conductive pads 218. The solder balls 223 may be substantially similar to the solder balls 123 described above in FIG. 1.

Referring now to FIG. 2J, a cross-sectional illustration of a semiconductor package 200 is shown, in accordance with an embodiment. In an embodiment, the carrier 201 and the adhesive layer 261 may be removed from below the dies 210-212 and the encapsulation layer 280 to expose the (top) surfaces of the dies 210-212. After removing the carrier 201 with the adhesive layer 261, the (top) surfaces of the dies 210-212 may be substantially coplanar to the (top) surface of the encapsulation layer 280.

Referring now to FIG. 2K, a cross-sectional illustration of a semiconductor package 200 is shown, in accordance with an embodiment. In an embodiment, the semiconductor package 200 may singulate the plurality of patches (packages) to form an individual patch (or package) that may be substantially similar to the semiconductor package 100 described above in FIG. 1. The singulation of the patches of the semiconductor package 200 may be implemented by dicing, sawing, lasering, etc., the plurality of patches into one patch as shown with the illustrated package in FIG. 2K.

Referring now to FIG. 2L, a cross-sectional illustration of a semiconductor package 200 is shown, in accordance with an embodiment. In an embodiment, the first conductive pads 218 of the HDP substrate 230 may be disposed and coupled onto the top surface of a package substrate 202. The package substrate 202 may be substantially similar to the package substrate 102 described above in FIG. 1. Additionally, as described above, an underfill material 254 may be disposed over the encapsulation layer 280 and the package substrate 202, where the underfill material 254 may be disposed between the HDP substrate 230 and the package substrate 202. The underfill material 254 may surround the first solder balls 223 and portions of the encapsulation layer 280. The underfill material 254 may be substantially similar to the underfill material 154 described above in FIG. 1.

Note that the semiconductor package 200 of FIGS. 2A-2L may include fewer or additional packaging components based on the desired packaging design.

Figure 3:
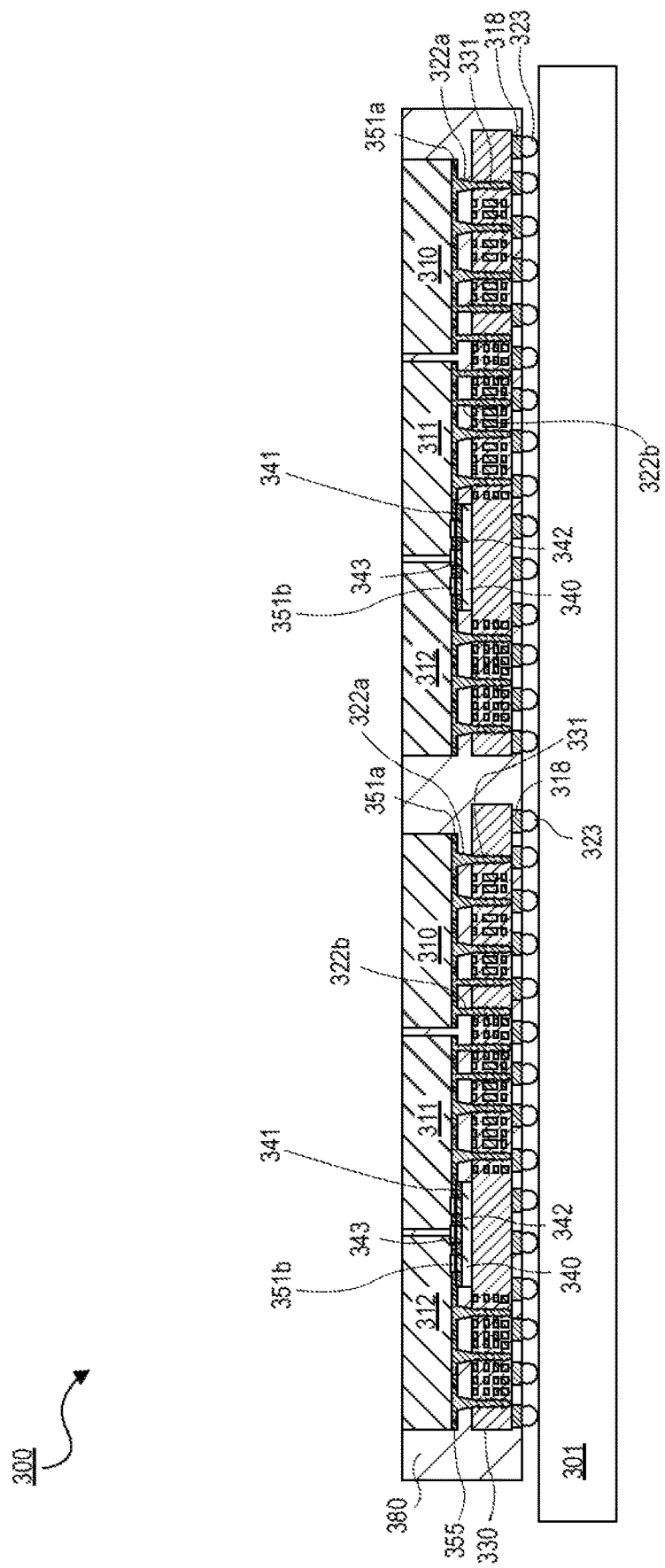
FIG. 3 is an illustration of a cross-sectional view of a semiconductor package with a plurality of dies, a plurality of HDP substrates, a plurality of thin bridges with hybrid layers, a plurality of first and second TMVs, and a package substrate, according to one embodiment.

Referring now to FIG. 3, a cross-sectional illustration of a semiconductor package 300 is shown, in accordance with an embodiment. The semiconductor package 300 may be substantially similar to the semiconductor packages 100 and 200 of FIGS. 1 and 2A-2L, with the exception that two set of dies 310-312 are respectively disposed over and coupled to two HDP substrates 330 and two thin bridges 340, and that one or more of the thin bridges 340 may include a plurality of TSVs if needed, thereby, if the TSVs are needed, the TSVs of the thin bridges 340 may be coupled (or soldered) directly to the HDP substrate 330 to supply power directly to the I/O circuits such as the dies 310-312 and/or the substrate 301.

Whereas one set of dies 110-112 are disposed over and coupled to one HDP substrate 130 and one thin bridge 140 in FIG. 1, the two set of dies 310-312 are disposed over and communicatively coupled to the respective HDP substrate 330 and the thin bridge 340 with ultrafine pitches in FIG. 3, thereby adding additional desired ICs such as the additional dies to improve the overall performance of the semiconductor package 300, while only using one thin bridge 340 with the ultrathin hybrid layer 341-343 to thus maintain a substantially reduced overall thickness (or z-height) for the semiconductor package 300.

Also, whereas the thin bridge 140 has the hybrid layer 141-143 without any TSVs in FIG. 1, the thin bridge 340 may implement the hybrid layer 341-343 with the TSVs in FIG. 3, thereby providing power directly to the respective dies 310-312 and/or the substrate 301 to improve the overall power performance of the semiconductor package 300. While, in each patch, two dies 310-312, one HDP substrate 330, and one thin bridge 340 are illustrated, it is to be appreciated that, in each patch, any number of dies 310-312, HDP substrates 330, and thin bridges 340 may be disposed (or positioned) on/over the substrate 301. Note that the semiconductor package 300 may be singulated from the two patches (or packages) into individual patches (or packages) as shown/described above in FIGS. 2K-2L.

In one embodiment, the substrate 301 may be a package substrate, a carrier, an interposer, and/or the like. Note, as described above, the semiconductor package 300 may be substantially similar to the semiconductor package 100 described above in FIG. 1. Likewise, the components of the semiconductor package 300 described above are substantially similar to the components of the semiconductor package 100 described above in FIG. 1. Additionally, the substrate 301, the dies 310-312, the TMVs 322a-b, the solder balls 323, the HDP substrate 330, the conductive interconnects 331, the thin bridge 340, the hybrid layer 341-343, the first and second conductive pads 318 and 351a-b, the dielectric layer 355, and the encapsulation layer 380 may be substantially similar to the package substrate 101, the dies 110-112, the TMVs 122a-b, the solder balls 123, the HDP substrate 130, the conductive interconnects 131, the thin bridge 140, the hybrid layer 141-143, the first and second conductive pads 118 and 151a-b, the dielectric layer 155, and the encapsulation layer 180 described above in FIG. 1.

Note that the semiconductor package 300 may include fewer or additional packaging components based on the desired packaging design.

Figure 4:
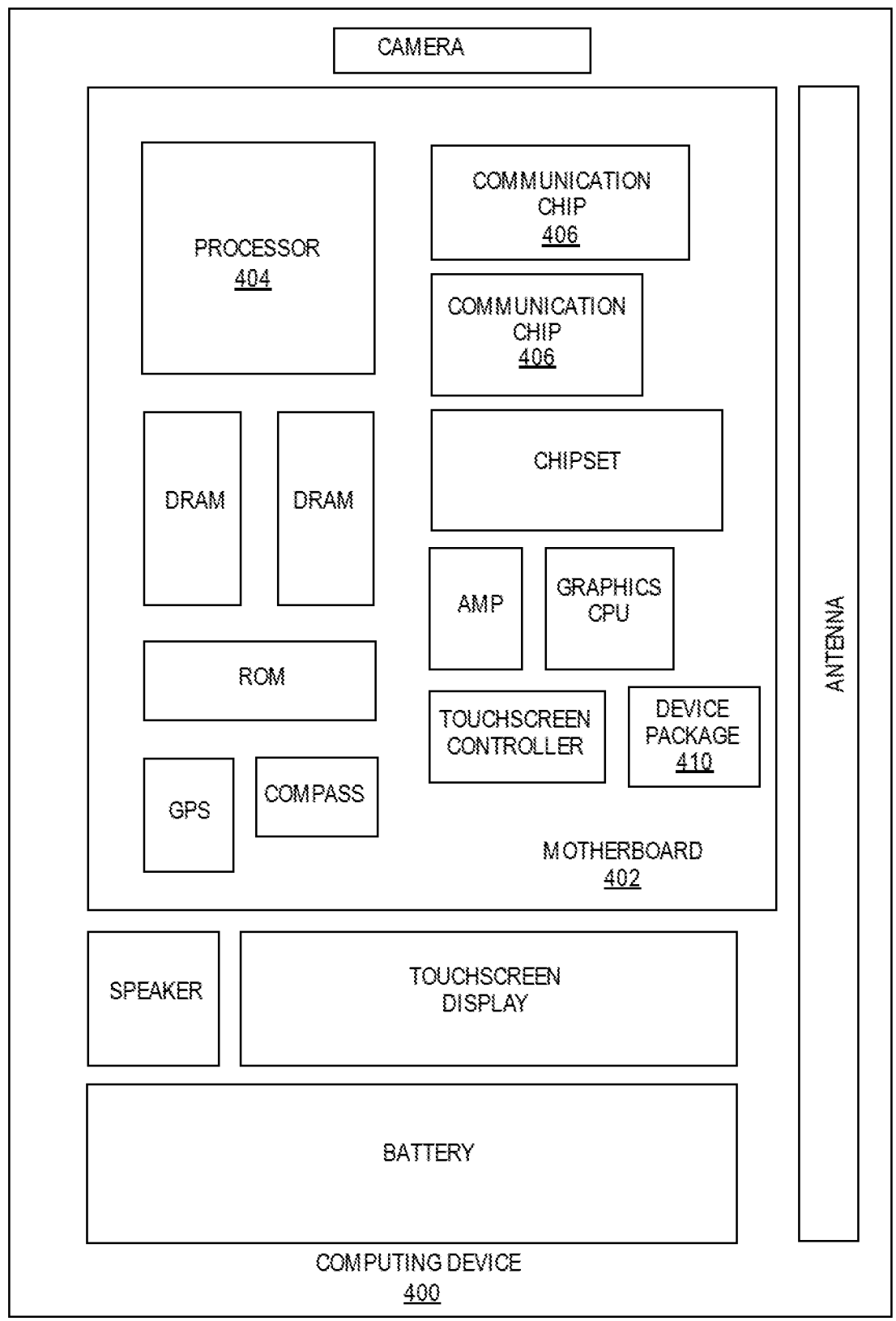
FIG. 4 is an illustration of a schematic block diagram illustrating a computer system that utilizes a semiconductor package with a plurality of dies, a HDP substrate, a thin bridge with a hybrid layer, a plurality of first and second TMVs, and a package substrate, according to one embodiment.

FIG. 4 is an illustration of a schematic block diagram illustrating a computer system 400 that utilizes a device package 410 (or a semiconductor package) with a plurality of dies, a HDP substrate, a thin bridge with a hybrid layer, a plurality of TMVs, and a package substrate, according to one embodiment. FIG. 4 illustrates an example of computing device 400. Computing device 400 houses a motherboard 402. Motherboard 402 may include a number of components, including but not limited to processor 404, device package 410 (or semiconductor package), and at least one communication chip 406. Processor 404 is physically and electrically coupled to motherboard 402. For some embodiments, at least one communication chip 406 is also physically and electrically coupled to motherboard 402. For other embodiments, at least one communication chip 406 is part of processor 404.

Depending on its applications, computing device 400 may include other components that may or may not be physically and electrically coupled to motherboard 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 406 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. Device package 410 may be a semiconductor package that may include, but is not limited to, a substrate, a package substrate, and/or a PCB. In one embodiment, device package 410 may be substantially similar to the semiconductor packages of FIGS. 1-3 described herein. Device package 410 may include dies, HDP substrates, thin bridges with hybrid layers, interconnects with varying widths (e.g., the conductive pads 151a-b and the TMVs 122a-b of FIG. 1), and package substrates as described herein (e.g., as illustrated and described above with the semiconductor packages of FIGS. 1-3)—or any other components from the figures described herein.

Note that device package 410 may be a single component/device, a subset of components, and/or an entire system, as the materials, features, and components may be limited to device package 410 and/or any other component of the computing device 400 that may need solder-less ultrathin bridges locked/coupled/disposed between the dies and the HDP substrates with ultrafine pitches and ultrathin hybrid layers as described herein (e.g., the motherboard 402, the processor 404, and/or any other component of the computing device 400 that may need the embodiments of the semiconductor packages described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 406 also includes an integrated circuit die packaged within the communication chip 406. For some embodiments, the integrated circuit die of the communication chip 406 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a bridge on a HDP substrate, wherein the bridge includes a hybrid layer; a plurality of dies over the bridge and the HDP substrate, wherein the bridge is coupled between the plurality of dies and the HDP substrate, wherein the bridge is directly coupled to two dies of the plurality of dies with the hybrid layer, wherein a top surface of the hybrid layer of the bridge is directly on bottom surfaces of the plurality of dies, and wherein a bottom surface of the bridge is directly on a top surface of the HDP substrate; and a plurality of TMVs on the HDP substrate, wherein the plurality of TMVs couple the HDP substrate to the plurality of dies, and wherein the plurality of TMVs have a thickness that is substantially equal to a thickness of the bridge.

In example 2, the subject matter of example 1 can optionally include that the hybrid layer of the bridge includes a plurality of conductive pads and a dielectric, and wherein the dielectric surrounds the plurality of conductive pads.

In example 3, the subject matter of examples 1-2 can optionally include that hybrid layer of the bridge further includes a surface finish, and wherein the surface finish is directly on top surfaces of the plurality of conductive pads.

In example 4, the subject matter of examples 1-3 can optionally include wherein the plurality of conductive pads are a plurality of copper pads, wherein the dielectric includes a silicon dioxide material, and wherein the surface finish includes a tin material.

In example 5, the subject matter of examples 1-4 can optionally include that wherein the bridge is an EMIB, and wherein the EMIB is communicatively coupled to the plurality of dies.

In example 6, the subject matter of examples 1-5 can optionally include the wherein the HDP substrate includes a plurality of conductive interconnects, wherein the plurality of dies include a plurality of second conductive pads and a first dielectric, wherein the plurality of second conductive pads and the first dielectric are on the bottom surfaces of the plurality of dies, wherein the first dielectric surrounds the plurality of second conductive pads, wherein the plurality of TMVs vertically extend from the top surface of the HDP substrate to the bottom surfaces of the plurality of dies, and wherein the plurality of TMVs conductively couple the plurality of conductive interconnects of the HDP substrate to the plurality of second conductive pads of the plurality of dies.

In example 7, the subject matter of examples 1-6 can optionally include a plurality of first conductive pads on a bottom surface of the HDP substrate; the HDP substrate over a package substrate, wherein the plurality of first conductive pads of the HDP substrate are conductively coupled to the package substrate with a plurality of solder balls; an encapsulation layer over and surrounds the plurality of dies, the plurality of first and second conductive pads, the first dielectric, the plurality of TMVs, the bridge, the hybrid layer, the HDP substrate, wherein the encapsulation layer has a top surface that is substantially coplanar to top surfaces of the plurality of dies, and wherein the encapsulation layer has a bottom surface that is substantially coplanar to bottom surfaces of the plurality of first conductive pads; and an underfill material over the encapsulation layer and the package substrate, wherein the underfill material is between the bottom surface of the encapsulation layer and a top surface of the package substrate, and wherein the underfill material surrounds the encapsulation layer and the plurality of solder balls.

In example 8, the subject matter of examples 1-7 can optionally include that wherein the plurality of TMVs include a plurality of first TMVs and a plurality of second TMVs, wherein the plurality of first TMVs have a width that is greater than a width of the plurality of second TMVs, wherein the plurality of second conductive pads include a plurality of third conductive pads and a plurality of fourth conductive pads, wherein the plurality of third conductive pads have a width that is greater than a width of the plurality of fourth conductive pads, wherein the plurality of first TMVs are directly coupled to the plurality of third conductive pads, and wherein the plurality of second TMVs are directly coupled to the plurality of fourth conductive pads.

In example 9, the subject matter of examples 1-8 can optionally include that the surface finish of the hybrid layer of the bridge is directly coupled to the plurality of fourth conductive pads of the two dies of the plurality of dies, and wherein the surface finish is directly in between the plurality of conductive pads of the hybrid layer of the bridge and the plurality of fourth conductive pads of the two dies of the plurality of dies.

In example 10, the subject matter of examples 1-9 can optionally include that the bridge is a thin bridge, and wherein the thin bridge has a thickness of approximately or less than 15 um, wherein the thin bridge is directly coupled to the two dies of the plurality of dies and the HDP substrate without a solder material, and wherein the thin bridge includes a plurality of TSVs to couple the HDP substrate and the plurality of dies.

Example 11 is a method of forming a semiconductor package, comprising: disposing a plurality of dies over a carrier, wherein the plurality of dies are coupled to the carrier with an adhesive layer; disposing a bridge over two dies of the plurality of dies, wherein the bridge includes a hybrid layer, and wherein the bridge is directly coupled to the two dies with the hybrid layer; disposing a plurality of TMVs over the plurality of dies, wherein the plurality of TMVs surround the bridge; disposing a encapsulation layer over the plurality of dies, the bridge, the hybrid layer, the plurality of TMVs, and the adhesive layer; and disposing a HDP substrate over the encapsulation layer, the plurality of TMVs, the bridge, and the plurality of dies, wherein the plurality of TMVs couple the HDP substrate to the plurality of dies, wherein the plurality of TMVs have a thickness that is substantially equal to a thickness of the bridge, wherein the bridge is coupled between the plurality of dies and the HDP substrate, wherein a top surface of the hybrid layer of the bridge is directly on bottom surfaces of the plurality of dies, and wherein a bottom surface of the bridge is directly on a top surface of the HDP substrate.

In example 12, the subject matter of example 11 can optionally include that the hybrid layer of the bridge includes a plurality of conductive pads and a dielectric, and wherein the dielectric surrounds the plurality of conductive pads.

In example 13, the subject matter of examples 11-12 can optionally include that hybrid layer of the bridge further includes a surface finish, and wherein the surface finish is directly on top surfaces of the plurality of conductive pads.

In example 14, the subject matter of examples 11-13 can optionally include that the plurality of conductive pads are a plurality of copper pads, wherein the dielectric includes a silicon dioxide material, and wherein the surface finish includes a tin material.

In example 15, the subject matter of examples 11-14 can optionally include that the bridge is an EMIB, and wherein the EMIB is communicatively coupled to the plurality of dies.

In example 16, the subject matter of examples 11-15 can optionally include that wherein the HDP substrate includes a plurality of conductive interconnects, wherein the plurality of dies include a plurality of second conductive pads and a first dielectric, wherein the plurality of second conductive pads and the first dielectric are on the bottom surfaces of the plurality of dies, wherein the first dielectric surrounds the plurality of second conductive pads, wherein the plurality of TMVs vertically extend from the top surface of the HDP substrate to the bottom surfaces of the plurality of dies, and wherein the plurality of TMVs conductively couple the plurality of conductive interconnects of the HDP substrate to the plurality of second conductive pads of the plurality of dies.

In example 17, the subject matter of examples 11-16 can optionally include disposing a plurality of first conductive pads on a bottom surface of the HDP substrate; disposing the encapsulation layer over and around the plurality of first conductive pads and the HDP substrate, wherein the encapsulation layer surrounds the plurality of dies, the plurality of first and second conductive pads, the first dielectric, the plurality of TMVs, the bridge, the hybrid layer, the HDP substrate, wherein the encapsulation layer has a top surface that is substantially coplanar to top surfaces of the plurality of dies, and wherein the encapsulation layer has a bottom surface that is substantially coplanar to bottom surfaces of the plurality of first conductive pads; removing the carrier to expose the top surface of the encapsulation layer and the top surfaces of the plurality of dies; disposing the bottom surfaces of the encapsulation layer and the HDP substrate over a package substrate, wherein the plurality of first conductive pads of the HDP substrate are conductively coupled to the package substrate with a plurality of solder balls; and disposing an underfill material over the encapsulation layer and the package substrate, wherein the underfill material is between the bottom surface of the encapsulation layer and a top surface of the package substrate, and wherein the underfill material surrounds the encapsulation layer and the plurality of solder balls.

In example 18, the subject matter of examples 11-17 can optionally include that the plurality of TMVs include a plurality of first TMVs and a plurality of second TMVs, wherein the plurality of first TMVs have a width that is greater than a width of the plurality of second TMVs, wherein the plurality of second conductive pads include a plurality of third conductive pads and a plurality of fourth conductive pads, wherein the plurality of third conductive pads have a width that is greater than a width of the plurality of fourth conductive pads, wherein the plurality of first TMVs are directly coupled to the plurality of third conductive pads, and wherein the plurality of second TMVs are directly coupled to the plurality of fourth conductive pads.

In example 19, the subject matter of examples 11-18 can optionally include that the surface finish of the hybrid layer of the bridge is directly coupled to the plurality of fourth conductive pads of the two dies of the plurality of dies, and wherein the surface finish is directly in between the plurality of conductive pads of the hybrid layer of the bridge and the plurality of fourth conductive pads of the two dies of the plurality of dies.

In example 20, the subject matter of examples 11-19 can optionally include that the bridge is a thin bridge, and wherein the thin bridge has a thickness of approximately or less than 15 um, wherein the thin bridge is directly coupled to the two dies of the plurality of dies and the HDP substrate without a solder material, and wherein the thin bridge includes a plurality of TSVs to couple the HDP substrate and the plurality of dies.

Example 21 is a semiconductor package, comprising: a HDP substrate over a package substrate; a bridge on the HDP substrate, wherein the bridge includes a hybrid layer, and wherein the hybrid layer includes a plurality of conductive pads, a surface finish, and a dielectric; a plurality of dies over the bridge and the HDP substrate, wherein the bridge is coupled between the plurality of dies and the HDP substrate, wherein the bridge is directly coupled to two dies of the plurality of dies with the hybrid layer, wherein a top surface of the hybrid layer of the bridge is directly on bottom surfaces of the plurality of dies, and wherein a bottom surface of the bridge is directly on a top surface of the HDP substrate; a plurality of TMVs on the HDP substrate, wherein the plurality of TMVs couple the HDP substrate to the plurality of dies, and wherein the plurality of TMVs have a thickness that is substantially equal to a thickness of the bridge; and an encapsulation layer over and surrounds the plurality of dies, the plurality of TMVs, the bridge, the hybrid layer, and the HDP substrate, wherein the encapsulation layer has a top surface that is directly on top surfaces of the plurality of dies.

In example 22, the subject matter of example 21 can optionally include that the dielectric surrounds the plurality of conductive pads, wherein the surface finish is directly on top surfaces of the plurality of conductive pads, wherein the plurality of conductive pads are a plurality of copper pads, wherein the dielectric includes a silicon dioxide material, and wherein the surface finish includes a tin material, wherein the bridge is an EMIB, and wherein the EMIB is communicatively coupled to the plurality of die.

In example 23, the subject matter of examples 21-22 can optionally include that the HDP substrate includes a plurality of conductive interconnects, wherein the plurality of dies include a plurality of second conductive pads and a first dielectric, wherein the plurality of second conductive pads and the first dielectric are on the bottom surfaces of the plurality of dies, wherein the first dielectric surrounds the plurality of second conductive pads, wherein the plurality of TMVs vertically extend from the top surface of the HDP substrate to the bottom surfaces of the plurality of dies, and wherein the plurality of TMVs conductively couple the plurality of conductive interconnects of the HDP substrate to the plurality of second conductive pads of the plurality of dies.

In example 24, the subject matter of examples 21-23 can optionally include a plurality of first conductive pads on a bottom surface of the HDP substrate, wherein the plurality of first conductive pads of the HDP substrate are conductively coupled to the package substrate with a plurality of solder balls, wherein the encapsulation layer surrounds the plurality of dies, the plurality of first and second conductive pads, the first dielectric, the plurality of TMVs, the bridge, the hybrid layer, the HDP substrate, wherein the encapsulation layer has a bottom surface that is substantially coplanar to bottom surfaces of the plurality of first conductive pads; an underfill material over the encapsulation layer and the package substrate, wherein the underfill material is between the bottom surface of the encapsulation layer and a top surface of the package substrate, and wherein the underfill material surrounds the encapsulation layer and the plurality of solder balls; and one or more thermal devices over the top surfaces of the plurality of dies and the top surface of the encapsulation layer.

In example 25, the subject matter of examples 21-24 can optionally include that the plurality of TMVs include a plurality of first TMVs and a plurality of second TMVs, wherein the plurality of first TMVs have a width that is greater than a width of the plurality of second TMVs, wherein the plurality of second conductive pads include a plurality of third conductive pads and a plurality of fourth conductive pads, wherein the plurality of third conductive pads have a width that is greater than a width of the plurality of fourth conductive pads, wherein the plurality of first TMVs are directly coupled to the plurality of third conductive pads, and wherein the plurality of second TMVs are directly coupled to the plurality of fourth conductive pads, wherein the surface finish of the hybrid layer of the bridge is directly coupled to the plurality of fourth conductive pads of the two dies of the plurality of dies, wherein the surface finish is directly in between the plurality of conductive pads of the hybrid layer of the bridge and the plurality of fourth conductive pads of the two dies of the plurality of dies, wherein the bridge is a thin bridge, wherein the thin bridge has a thickness of approximately or less than 15 um, wherein the thin bridge is directly coupled to the two dies of the plurality of dies and the HDP substrate without a solder material, and wherein the thin bridge includes a plurality of TSVs to couple the HDP substrate and the plurality of dies.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:
1. A semiconductor package, comprising:
    a bridge on a high-density packaging (HDP) substrate, wherein the bridge includes a hybrid layer;
    a plurality of dies over the bridge and the HDP substrate, wherein the bridge is coupled between the plurality of dies and the HDP substrate, wherein the bridge is directly coupled to two dies of the plurality of dies with the hybrid layer, wherein a top surface of the hybrid layer of the bridge is directly on bottom surfaces of the plurality of dies, and wherein a bottom surface of the bridge is directly on a top surface of the HDP substrate;
    a single encapsulation layer on the HDP substrate, the single encapsulation layer laterally surrounding the bridge and the plurality of dies; and
    a plurality of through mold vias (TMVs) on the HDP substrate and in the single encapsulation layer, wherein the plurality of TMVs couple the HDP substrate to the plurality of dies, and wherein the plurality of TMVs have a thickness that is substantially equal to a thickness of the bridge.

2. The semiconductor package of claim 1, wherein the hybrid layer of the bridge includes a plurality of conductive pads and a dielectric, and wherein the dielectric surrounds the plurality of conductive pads.

3. The semiconductor package of claim 2, wherein the hybrid layer of the bridge further includes a surface finish, and wherein the surface finish is directly on top surfaces of the plurality of conductive pads.

4. The semiconductor package of claim 3, wherein the plurality of conductive pads are a plurality of copper pads, wherein the dielectric includes a silicon dioxide material, and wherein the surface finish includes a tin material or a copper material.

5. The semiconductor package of claim 4, wherein the HDP substrate includes a plurality of conductive interconnects, wherein the plurality of dies include a plurality of second conductive pads and a first dielectric, wherein the plurality of second conductive pads and the first dielectric are on the bottom surfaces of the plurality of dies, wherein the first dielectric surrounds the plurality of second conductive pads, wherein the plurality of TMVs vertically extend from the top surface of the HDP substrate to the bottom surfaces of the plurality of dies, and wherein the plurality of TMVs conductively couple the plurality of conductive interconnects of the HDP substrate to the plurality of second conductive pads of the plurality of dies.

6. The semiconductor package of claim 5, further comprising:
    a plurality of first conductive pads on a bottom surface of the HDP substrate;
    the HDP substrate over a package substrate, wherein the plurality of first conductive pads of the HDP substrate are conductively coupled to the package substrate with a plurality of solder ball,
    wherein the single encapsulation layer has a top surface that is substantially coplanar to top surfaces of the plurality of dies, and wherein the single encapsulation layer has a bottom surface that is substantially coplanar to bottom surfaces of the plurality of first conductive pads; and
    an underfill material over the single encapsulation layer and the package substrate, wherein the underfill material is between the bottom surface of the single encapsulation layer and a top surface of the package substrate, and wherein the underfill material surrounds the single encapsulation layer and the plurality of solder balls.

7. The semiconductor package of claim 6, wherein the plurality of TMVs include a plurality of first TMVs and a plurality of second TMVs, wherein the plurality of first TMVs have a width that is greater than a width of the plurality of second TMVs, wherein the plurality of second conductive pads include a plurality of third conductive pads and a plurality of fourth conductive pads, wherein the plurality of third conductive pads have a width that is greater than a width of the plurality of fourth conductive pads, wherein the plurality of first TMVs are directly coupled to the plurality of third conductive pads, and wherein the plurality of second TMVs are directly coupled to the plurality of fourth conductive pads.

8. The semiconductor package of claim 7, wherein the surface finish of the hybrid layer of the bridge is directly coupled to the plurality of fourth conductive pads of the two dies of the plurality of dies, and wherein the surface finish is directly in between the plurality of conductive pads of the hybrid layer of the bridge and the plurality of fourth conductive pads of the two dies of the plurality of dies.

9. The semiconductor package of claim 8, wherein the bridge is a thin bridge, and wherein the thin bridge has a thickness of approximately or less than 15 um, wherein the thin bridge is directly coupled to the two dies of the plurality of dies and the HDP substrate without a solder material, and wherein the thin bridge includes a plurality of through silicon vias (TSVs) to couple the HDP substrate and the plurality of dies.

10. The semiconductor package of claim 1, wherein the bridge is an embedded multi-die interconnect bridge (EMIB), and wherein the EMIB is communicatively coupled to the plurality of dies.

11. A semiconductor package, comprising:
  a high-density packaging (HDP) substrate over a package substrate;
  a bridge on the HDP substrate, wherein the bridge includes a hybrid layer, and wherein the hybrid layer includes a plurality of conductive pads, a surface finish, and a dielectric;
  a plurality of dies over the bridge and the HDP substrate, wherein the bridge is coupled between the plurality of dies and the HDP substrate, wherein the bridge is directly coupled to two dies of the plurality of dies with the hybrid layer, wherein a top surface of the hybrid layer of the bridge is directly on bottom surfaces of the plurality of dies, and wherein a bottom surface of the bridge is directly on a top surface of the HDP substrate;
  a plurality of through mold vias (TMVs) on the HDP substrate, wherein the plurality of TMVs couple the HDP substrate to the plurality of dies, and wherein the plurality of TMVs have a thickness that is substantially equal to a thickness of the bridge; and
  a single encapsulation layer over and laterally surrounding the plurality of dies, the plurality of TMVs, the bridge, the hybrid layer, and the HDP substrate, wherein the single encapsulation layer has a top surface that is substantially coplanar to top surfaces of the plurality of dies.

12. The semiconductor package of claim 11, wherein the dielectric surrounds the plurality of conductive pads, wherein the surface finish is directly on top surfaces of the plurality of conductive pads, wherein the plurality of conductive pads are a plurality of copper pads, wherein the dielectric includes a silicon dioxide material, and wherein the surface finish includes a tin material or a copper material, wherein the bridge is an embedded interconnect bridge, and wherein the EMIB is communicatively coupled to the plurality of dies.

13. The semiconductor package of claim 12, wherein the HDP substrate includes a plurality of conductive interconnects, wherein the plurality of dies include a plurality of second conductive pads and a first dielectric, wherein the plurality of second conductive pads and the first dielectric are on the bottom surfaces of the plurality of dies, wherein the first dielectric surrounds the plurality of second conductive pads, wherein the plurality of TMVs vertically extend from the top surface of the HDP substrate to the bottom surfaces of the plurality of dies, and wherein the plurality of TMVs conductively couple the plurality of conductive interconnects of the HDP substrate to the plurality of second conductive pads of the plurality of dies.

14. The semiconductor package of claim 13, further comprising:
  a plurality of first conductive pads on a bottom surface of the HDP substrate, wherein the plurality of first conductive pads of the HDP substrate are conductively coupled to the package substrate with a plurality of solder balls, wherein the single encapsulation layer surrounds the plurality of dies, the plurality of first and second conductive pads, the first dielectric, the plurality of TMVs, the bridge, the hybrid layer, the HDP substrate, wherein the single encapsulation layer has a bottom surface that is substantially coplanar to bottom surfaces of the plurality of first conductive pads;
  an underfill material over the single encapsulation layer and the package substrate, wherein the underfill material is between the bottom surface of the single encapsulation layer and a top surface of the package substrate, and wherein the underfill material surrounds the single encapsulation layer and the plurality of solder balls; and
  one or more thermal devices over the top surfaces of the plurality of dies and the top surface of the single encapsulation layer.

15. The semiconductor package of claim 14, wherein the plurality of TMVs include a plurality of first TMVs and a plurality of second TMVs, wherein the plurality of first TMVs have a width that is greater than a width of the plurality of second TMVs, wherein the plurality of second conductive pads include a plurality of third conductive pads and a plurality of fourth conductive pads, wherein the plurality of third conductive pads have a width that is greater than a width of the plurality of fourth conductive pads, wherein the plurality of first TMVs are directly coupled to the plurality of third conductive pads, and wherein the plurality of second TMVs are directly coupled to the plurality of fourth conductive pads, wherein the surface finish of the hybrid layer of the bridge is directly coupled to the plurality of fourth conductive pads of the two dies of the plurality of dies, wherein the surface finish is directly in between the plurality of conductive pads of the hybrid layer of the bridge and the plurality of fourth conductive pads of the two dies of the plurality of dies, wherein the bridge is a thin bridge, wherein the thin bridge has a thickness of approximately or less than 15 um, wherein the thin bridge is directly coupled to the two dies of the plurality of dies and the HDP substrate without a solder material, and wherein the thin bridge includes a plurality of TSVs to couple the HDP substrate and the plurality of dies.

16. A semiconductor package, comprising:
  a bridge on a high-density packaging (HDP) substrate, wherein the bridge includes a hybrid layer;
  a plurality of dies over the bridge and the HDP substrate, wherein the bridge is coupled between the plurality of dies and the HDP substrate, wherein the bridge is directly coupled to two dies of the plurality of dies with the hybrid layer, wherein a top surface of the hybrid layer of the bridge is directly on bottom surfaces of the plurality of dies, and wherein a bottom surface of the bridge is directly on a top surface of the HDP substrate;

a plurality of through mold vias (TMVs) on the HDP substrate, wherein the plurality of TMVs couple the HDP substrate to the plurality of dies, and wherein the plurality of TMVs have a thickness that is substantially equal to a thickness of the bridge, wherein the hybrid layer of the bridge includes a plurality of conductive pads and a dielectric, and wherein the dielectric surrounds the plurality of conductive pads, wherein the hybrid layer of the bridge further includes a surface finish, and wherein the surface finish is directly on top surfaces of the plurality of conductive pads, wherein the plurality of conductive pads are a plurality of copper pads, wherein the dielectric includes a silicon dioxide material, and wherein the surface finish includes a tin material or a copper material, wherein the HDP substrate includes a plurality of conductive interconnects, wherein the plurality of dies include a plurality of second conductive pads and a first dielectric, wherein the plurality of second conductive pads and the first dielectric are on the bottom surfaces of the plurality of dies, wherein the first dielectric surrounds the plurality of second conductive pads, wherein the plurality of TMVs vertically extend from the top surface of the HDP substrate to the bottom surfaces of the plurality of dies, and wherein the plurality of TMVs conductively couple the plurality of conductive interconnects of the HDP substrate to the plurality of second conductive pads of the plurality of dies;

a plurality of first conductive pads on a bottom surface of the HDP substrate;

the HDP substrate over a package substrate, wherein the plurality of first conductive pads of the HDP substrate are conductively coupled to the package substrate with a plurality of solder balls;

an encapsulation layer over and surrounds the plurality of dies, the plurality of first and second conductive pads, the first dielectric, the plurality of TMVs, the bridge, the hybrid layer, the HDP substrate, wherein the encapsulation layer has a top surface that is substantially coplanar to top surfaces of the plurality of dies, and wherein the encapsulation layer has a bottom surface that is substantially coplanar to bottom surfaces of the plurality of first conductive pads; and an underfill material over the encapsulation layer and the package substrate, wherein the underfill material is between the bottom surface of the encapsulation layer and a top surface of the package substrate, and wherein the underfill material surrounds the encapsulation layer and the plurality of solder balls.

* * * * *